United States Patent [19]

Pruessner

[11] 3,986,003
[45] Oct. 12, 1976

[54] MULTI POSITION SOLID STATE TOUCH SWITCH

[75] Inventor: Manfred K. Pruessner, Rockville, Md.

[73] Assignee: The United States of America as represented by the Secretary of the Navy, Washington, D.C.

[22] Filed: Mar. 21, 1975

[21] Appl. No.: 560,833

[52] U.S. Cl. .................. 235/92 EA; 235/92 EV; 235/92 DP; 235/92 R
[51] Int. Cl.² ........................................ H03K 21/08
[58] Field of Search ........ 235/92 EV, 92 K, 92 CP, 235/92 CT, 92 DP, 92 EA, 92 PB, 92 SH

[56] References Cited
UNITED STATES PATENTS

| 2,947,865 | 8/1960 | Estrems et al. | 235/92 CT |
| 2,947,874 | 8/1960 | Tomlinson | 235/92 CT |
| 3,852,575 | 12/1974 | Daniels et al. | 235/92 CT |

Primary Examiner—Gareth D. Shaw
Assistant Examiner—John P. Vandenburg
Attorney, Agent, or Firm—R. Sciascia; R. Beers; S. Sheinbein

[57] ABSTRACT

A solid state switch to step through its positions automatically so long as an activator plate is touched, or which can be stepped up or down with each touch, as well as switch both digital and analog signals.

8 Claims, 1 Drawing Figure

U.S. Patent  Oct. 12, 1976  3,986,003
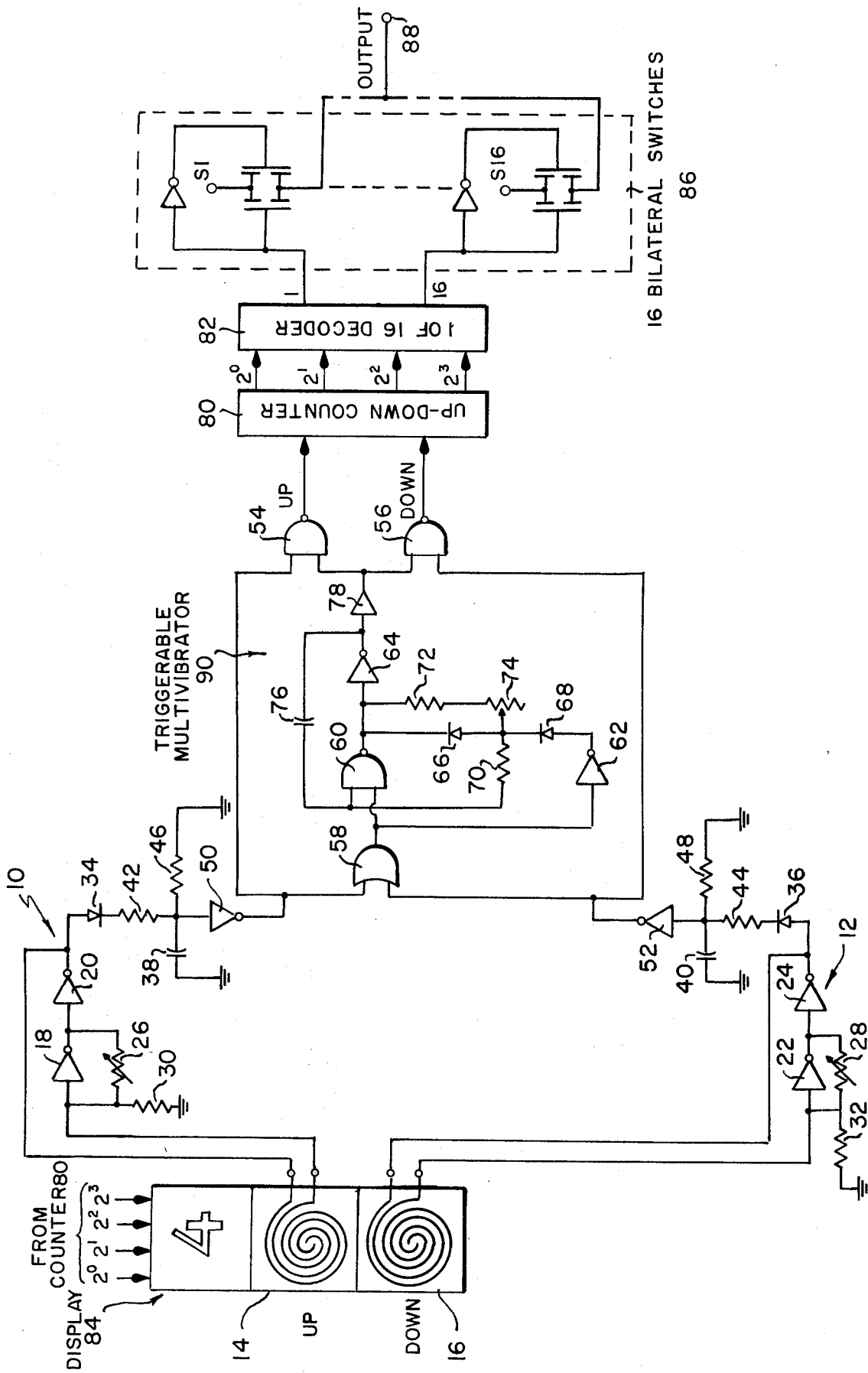

MULTI POSITION SOLID STATE TOUCH SWITCH

BACKGROUND OF THE INVENTION

The present invention relates to switching devices and more specifically to a touch activated solid state switch.

Switching devices employed in multi-channel devices such as data entry or channel selection for any signal processing systems, such as sonar, radar, and computers employ mechanical switches and relays. They are therefore quite bulky and noisy as well as requiring an AC control voltage and mechanical contacts, thereby reducing their reliability. Solid state touch switch by MAGIC DOT provides one position momentary ON-OFF or toggle action with a digital output as control function with ON-OFF light indicator. It also requires a 60-Hz control input voltage.

SUMMARY OF THE INVENTION

Accordingly, there is provided a touch activated switch for enabling either a digital or analog signal to be supplied by having two normally oscillating oscillators. Touching of their respective capacitor causes cessation of oscillation enabling either an "up" or "down" count to be provided from a triggerable multivibrator to an up-down counter which provides the desired number to a 1-of-16 decoder as well as to a decimal display.

OBJECTS OF THE INVENTION

It is therefore an object of the present invention to provide a touch activated switch.

Another object of the present invention is to provide an up-down digital-analog switch.

Still another object of the present invention is to provide a small, quiet, inexpensive, sensitive and efficient touch activated switch.

A still further object of the present invention is to provide a reliable, miniature solid state touch activated switch with electronic display.

Other objects, advantages and novel features of the invention will become apparent from the following detailed description of the invention when considered in conjunction with the accompanying drawings wherein:

The FIGURE illustrates in block diagram form the touch activated switch according to the invention.

DESCRIPTION OF THE PREFERRED EMBODIMENTS

Referring now to the FIGURE, both touch activated oscillators 10 and 12 are normally on, whose oscillations are stopped by touching touch capacitors 14 and 16, respectively. "Up" capacitor 14 and "down" capacitor 16 comprise a few turns of printed conductor on an insulating substrate. When covered by a thin film of a nonconductive material, a finger touch will result in a shunt capacity diverting some of the feedback signal to ground. Capacitors 14 and 16 therefore provide the positive feedback of the signals after being shifted 360° by inverters 18 and 20, and 22 and 24, respectively. Potentiometer 26 across inverter 18, and potentiometer 28 across inverter 22, provide the discharge path for capacitors 14 and 16, respectively, so that inverters 18 and 22, respectively, are turned on and off. Potentiometers 26 and 28 serve to shift the normal frequency of oscillation closer to, or further away, from the break-off point and determine the sensitivity of the circuit. Resistors 30 and 32, larger than potentiometers 26 and 28, respectively, assure proper biasing of inverters 18 and 22, respectively, such that the output of inverters 20 and 24, respectively, is safely at its logic low when is oscillations have stopped.

Diode 34, coupled to the output of oscillator 10, and diode 36, coupled to the output of oscillator 12, maintain capacitors 38 and 40, respectively, coupled thereto through resistors 42 and 44, respectively, charged to the logic high level of inverters 20 and 24, respectively, during the normal state of oscillation. When oscillations stop, capacitor 38 discharges through resistor 46 and capacitor 40 discharges through resistor 48. Resistors 42 and 44, both much smaller than resistors 46 and 48, respectively, provide a charging time constant to reduce spurious noise during triggering ("contact bounce"). The output of inverters 50 and 52, coupled to resistors 42 and 44, respectively, is a step function with a normally logic low going to a logic high when either of capacitors 14 and 16, respectively, is touched. The outputs of inverters 50 and 52 are supplied to NAND gates 54 and 56, respectively, as well as to OR gate 58.

NAND gate 60, inverters 62 and 64, diodes 66 and 68, resistors 70 and 72, potentiometer 74 and capacitor 76 comprise a triggerable multivibrator 90. Since the output of OR gate 58 is normally low, the multivibrator 90 is off. When capacitor 14 or 16 is being touched, the output of OR gate 58 rises and triggers the multivibrator 90 to oscillate with a toggle rate of 1 to 3 Hz, adjustable by potentiometer 74. Diode 66 shortens resistor 72 and potentiometer 74 during the positive half cycle of the output of inverter 64 so that the square wave is unsymmetric. Diode 68 and inverter 62, coupled to OR gate 58, assure retriggering within a short time after the touch plate of capacitors 14 and 16 has been released.

Therefore, up-down counter 80 can be stepped, through the non-inverting amplifying buffer 78 which supplies the other input and NAND gates 54 and 56, either automatically, at a convenient rate of 1 Hz to 3 Hz as long as capacitors 14 and 16 are being touched, or by repeated touching. NAND gates 54 and 56 supply the "up" and "down" count, respectively, to up-down counter 80. The output of counter 80 is supplied to the 1-of-16 decoder 82 and decimal display 84 situated near capacitors 14, 16 of the count position. The outputs of decoder 82 serve as control inputs to 16 bilateral switches 86 whose outputs are then coupled together to provide output 88. This common output 88 is therefore any digital or analog signal S1 to S16 determined by the touch capacitors 14 and 16.

There has therefore been described a touch activated multiposition switch wherein any number of possible positions may be chosen by appropriate reset of the counter along with electronic display of the decimal readout. Both automatic stepping at an adjustable toggle rate or single stepping through a retriggerable multivibrator may be employed. Up and down stepping, along with both analog and digital signals is employed. Commercially available MOS devices may be used. AC control voltage is not necessary, with a TLL or MOS supply sufficient. Sensitivity adjustment allows for proximity action. The size of the unit is relatively small compared to mechanical rotational or slide switches as well as having noiseless and long lifetime characteristics.

For purposes of illustration, of specific embodiment of the invention has been disclosed but it is recognized that many modifications may appear to a person skilled in the art without departing from the intended scope of the claims. For example, the touch activated oscillator can be normally "off", and "on" only when touched. Any convenient shape may be employed for the touch button so as to facilitate physical contact. The outputs of the bilateral switches can supply signal to separate or arbitrarily grouped loads.

While the salient features of the present invention have been described in detail with respect to one embodiment, it will, of course, be apparent that numerous modifications may be made within the scope and spirit of the invention and it is therefore not desired to limit the invention to the exact details shown except insofar as they may be defined in the following claims.

What is claimed as new and desired to be secured by Letters Patent of the United States is:

1. A solid state touch activated multi-position switch comprising:
    at least one normally-on oscillating oscillator;
    a touch capacitor coupled to the input of said oscillator wherein touching said capacitor causes said oscillator to cease oscillating, causing said oscillator to provide a logical output as a switching criterion;
    logic circuitry coupled to the output of said oscillator to receive said logical output;
    an up-down counter coupled to the output of said logic circuitry to be stepped by the output of said logic circuitry; and
    means coupled to the output of said up-down counter for decoding said up-down counter to select a desired switch.

2. A solid state touch activated switch as recited in claim 1 wherein said logic circuitry comprises a triggerable multivibrator which steps said up-down counter at a preselected frequency rate.

3. A solid state touch activated switch as recited in claim 2 wherein two oscillators are controlled by respective touch capacitors coupled thereto, one of said oscillators providing an "up" count to said counter, with the other oscillator providing a "down" count to said counter.

4. A solid state touch activated switch as recited in claim 3 further including display means coupled to said up-down counter for visually displaying the count in said counter, and wherein each of said capacitors comprises a few turns of printed conductor on an insulating substrate.

5. A solid state touch activated switch as recited in claim 4 wherein said decoding means comprises a 1 of 16 decoder controlling respective sixteen bilateral switches.

6. A solid state touch activated switch as recited in claim 5 wherein said two oscillators are identical and comprise logic circuitry to provide a logical high output, when its respective capacitor is touched, to the input of said triggerable multivibrator and to respective coincidence gates said coincidence gates comprising inputs to said up-down counter.

7. A solid state touch activated switch as recited in claim 6 wherein said triggerable multivibrator comprises logic circuitry to provide said output to said coincidence gates at a rate of 1 Hz to 3 Hz or whenever either of said capacitors is touched.

8. A solid state touch activated switch as recited in claim 6 further including a capacitor coupled between the output of each of said oscillators and said coincidence gates and triggerable multivibrator to provide said logical output thereto upon the touching of its respective touch capacitor.

* * * * *